(12) United States Patent
Raghunathan et al.

(10) Patent No.: US 12,078,853 B2
(45) Date of Patent: Sep. 3, 2024

(54) SEMICONDUCTOR PACKAGE WITH EMBEDDED OPTICAL DIE

(71) Applicant: Intel Corporation, Santa Clara, CA (US)

(72) Inventors: Vivek Raghunathan, Tempe, AZ (US); Myung Jin Yim, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 195 days.

(21) Appl. No.: 17/474,484

(22) Filed: Sep. 14, 2021

(65) Prior Publication Data

US 2021/0405306 A1    Dec. 30, 2021

Related U.S. Application Data

(63) Continuation of application No. 16/317,796, filed as application No. PCT/US2016/042287 on Jul. 14, 2016, now Pat. No. 11,156,788.

(51) Int. Cl.
G02B 6/42    (2006.01)
G02B 6/122   (2006.01)
G02B 6/132   (2006.01)
H01L 25/16   (2023.01)

(52) U.S. Cl.
CPC ......... *G02B 6/4206* (2013.01); *G02B 6/122* (2013.01); *G02B 6/132* (2013.01); *G02B 6/42* (2013.01); *G02B 6/4212* (2013.01); *G02B 6/4225* (2013.01); *G02B 6/428* (2013.01); *H01L 25/167* (2013.01)

(58) Field of Classification Search
CPC ..... H01L 25/0657; H01L 25/167; G02B 6/42; G02B 6/122; G02B 6/4206; G02B 6/136; G02B 6/132; G02B 6/4214; G02B 6/4225; G02B 6/4212; G02B 6/428
See application file for complete search history.

(56) References Cited

U.S. PATENT DOCUMENTS

| | | | |
|---|---|---|---|
| 6,845,184 B1 * | 1/2005 | Yoshimura | H01L 23/48 385/9 |
| 9,182,544 B2 * | 11/2015 | Kobrinsky | G02B 6/4245 |
| 9,946,042 B2 * | 4/2018 | Rickman | G02B 6/4295 |
| 9,998,234 B2 * | 6/2018 | Kaikkonen | H04B 10/40 |
| 10,330,872 B2 * | 6/2019 | Rosenberg | G02B 6/423 |
| 10,859,776 B2 * | 12/2020 | Yoo | H01L 24/81 |
| 2005/0053319 A1 * | 3/2005 | Doan | G02B 6/12 385/14 |
| 2014/0203175 A1 * | 7/2014 | Kobrinsky | H04B 10/25 250/214.1 |
| 2014/0252411 A1 * | 9/2014 | Kang | G02B 6/122 438/69 |
| 2014/0334768 A1 * | 11/2014 | Chang | G02B 6/4204 438/27 |

(Continued)

*Primary Examiner* — Michelle R Connelly
*Assistant Examiner* — Mary A El-Shammaa
(74) *Attorney, Agent, or Firm* — Akona IP PC

(57) ABSTRACT

Semiconductor package with one or more optical die(s) embedded therein is disclosed. The optical die(s) may have one or more overlying interconnect layers. Electrical contact to the optical die may be via the one or more overlying interconnect layers. An optical waveguide may be disposed next to the optical die and embedded within the semiconductor package. An optical fiber may be optically coupled to the optical waveguide.

18 Claims, 7 Drawing Sheets

(56) References Cited

U.S. PATENT DOCUMENTS

| | | | |
|---|---|---|---|
| 2015/0253511 A1* | 9/2015 | Pelley | H04B 10/803 |
| | | | 385/14 |
| 2016/0154177 A1* | 6/2016 | Han | G02B 6/4251 |
| | | | 385/14 |
| 2016/0266332 A1* | 9/2016 | Fasano | G02B 6/4202 |
| 2017/0199328 A1* | 7/2017 | Shubin | G02B 6/1228 |
| 2017/0330876 A1* | 11/2017 | Leedy | G02B 6/12002 |
| 2018/0180826 A1* | 6/2018 | Merget | G02B 6/136 |
| 2018/0188448 A1* | 7/2018 | Yim | H01L 23/3675 |

* cited by examiner

SEMICONDUCTOR PACKAGE WITH EMBEDDED OPTICAL DIE

CROSS-REFERENCE TO RELATED APPLICATION(S)

This application is a continuation of U.S. application Ser. No. 16/317,796, filed Jan. 14, 2019, which is a U.S. National Stage Application under 35 U.S.C. 371 and claims the priority benefit of PCT International Application No. PCT/US2016/042287, filed Jul. 14, 2016, the disclosures of which are incorporated herein by reference as if set forth in full.

TECHNICAL FIELD

This disclosure generally relates to semiconductor packages, and more particularly to semiconductor packages with embedded optical die.

BACKGROUND

Integrated circuit(s) and other electronic devices may be packaged on a semiconductor package. The semiconductor package may be integrated onto an electronic system, where relatively high speed communications between electronic devices and/or between various semiconductor packages may be desired. The use of optical die assembled onto a surface of a semiconductor package may result in relatively long optical path lengths, a number of optical interfaces, and/or manufacturability issues.

BRIEF DESCRIPTION OF THE FIGURES

Reference will now be made to the accompanying drawings, which are not necessarily drawn to scale, and wherein.

DETAILED DESCRIPTION OF EMBODIMENTS OF THE DISCLOSURE

Figure 1:
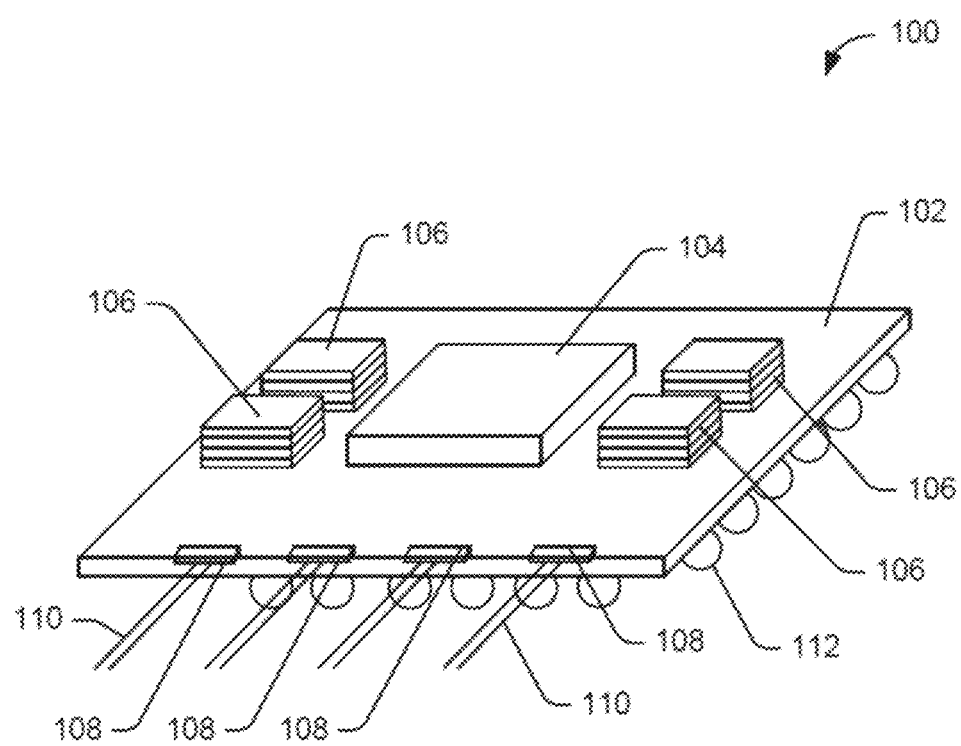
FIG. 1 depicts a simplified profile schematic diagram illustrating an example semiconductor package with embedded optical die, in accordance with example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein includes deposition of material or photoresist, patterning, exposure, development, etching, cleaning, ablating, polishing, and/or removal of the material or photoresist as required in forming a described structure.

In accordance with example embodiments of the disclosure, semiconductor packages may have optical die embedded therein (e.g., in a cavity formed within the semiconductor package) with an optical fiber coupled to the optical die. In some example embodiments, the optical die may be any suitable type of optical die, such as an edge emitting laser diode. The optical die may be aligned and/or placed in a cavity formed within the semiconductor package. The cavity may be formed by removing portions of one or more build-up layers (e.g., pre-preg layers, etc.) on the surface of the semiconductor package, such as on the edge of the semiconductor package. Such a cavity may be formed by any suitable mechanism, such as laser ablation, etch, controlled depth saw, or the like. The optical die, in example embodiments, may be positioned and placed in the cavity by a pick-and-place assembly tool. The optical die may have electrical contacts on a top surface of the optical die (e.g., on a surface opposing the surface with which the optical die sits on a surface of the cavity).

According to example embodiments of the disclosure, after the optical die may be placed within the cavity formed within the semiconductor package, an optical waveguide may be formed adjacent to the optical die within the cavity. In example embodiments, the waveguide may have a core portion sandwiched between cladding portions. In some example embodiments, the optical waveguide may be formed by depositing optical epoxy adjacent to the optical die within the cavity and curing the optical epoxy. The optical epoxy may be deposited in proximity of the optical die by a dispense nozzle, such as a dispense nozzle with sub-micron positional accuracy, according to some example embodiments. In some example embodiments, optical epoxy corresponding to a bottom cladding of the waveguide, optical epoxy corresponding to the sandwiched core of the waveguide, and optical epoxy corresponding to a top cladding of the waveguide may be disposed in sequence and either cured after each layer deposition or after the deposition of all of the layers of the waveguide. The core portion of the optical waveguide may have different properties (e.g., different refractive index, etc.) than the cladding portions of the optical waveguide. In some example embodiments, the core portion of the optical waveguide may have a refractive index in the range of about 1.3 to about 1.8. In some example embodiments, the cladding portions of the optical waveguide may have a refractive index in the range of about 1.4 to about 1.8. In example embodiments, a patterning process may be used after the deposition of the cladding polymer/core polymer/cladding polymer to define the waveguide. In example embodiments, the optical waveguide may be formed with dimensions such that the core portion of the optical waveguide is relatively aligned with an optical output (e.g., edge laser emission) of the optical die. In other words, the optical waveguide may be formed in a manner such that the optical emission from the optical die may be substantially coupled to and guided (e.g., by total internal reflection) by the core of the optical waveguide.

After the optical die is disposed in the cavity and a waveguide is formed adjacent to the optical die in the cavity, one or more interconnect layer(s) with metallic traces may be formed, at least partially, over the optical die and the optical waveguide, in example embodiments. The overlying one or more interconnect layer(s) may be one or more build-up dielectric layers and/or a solder mask layer. A build-up layer and/or a solder mask layer may be formed over the semiconductor package with the optical die disposed in the cavity in a manner so that the electrical contacts of the optical die may be contacted by metallic traces on the interconnect layer(s) formed overlying the optical die. In example embodiments, the dielectric material of the overlying interconnect material may encapsulate the optical die and the adjacent optical waveguide. Thus, in example embodiments, the dielectric (e.g., build-up laminate dielectric/pre-preg, etc.) may fill open portions of the cavity in which the optical die and the waveguide are disposed, to provide a substantially planarized top surface of the interconnect layer(s) formed overlying the optical die and the waveguide.

According to example embodiments of the disclosure, after the optical die and the optical waveguide is covered by one or more overlying interconnect layers (e.g., build-up layer(s) and/or solder mask layer), electronic components may be assembled onto the semiconductor package. The electronic components may be any suitable devices, including, for example, integrated circuit (IC) dies, radio frequency ICs (RFICs), surface mount devices (SMDs), connectors, passive components, active components, etc. There may be any suitable number of electronic components assembled onto the semiconductor package.

After electronic components are assembled onto the semiconductor package, a second cavity may be formed adjacent to the optical waveguide. In example embodiments, this second cavity may be formed in dielectric material that may have filled in portions of the first cavity during the formation of the interconnect layers overlying the optical die and/or the optical waveguide. This second cavity may be formed at the same or similar depth as the first cavity within which the optical die was embedded, in some example embodiments. In other example embodiments, the depth of the second cavity may be different from the depth of the first cavity in which the optical die was disposed. In alternative embodiments, the second cavity may be formed prior to assembly of dies and/or other electronic components onto the semiconductor package with embedded optical die.

In example embodiments, epoxy of any suitable type, such as a stage-B epoxy may be deposited within the second cavity. At this point a positioning tool may be used to position and place a butt of an optical fiber within the second cavity such that the optical fiber is relatively aligned with the optical waveguide. In other words, the optical fiber may be placed such that light travelling through the core portion of the optical waveguide may be coupled to the optical fiber. In some cases, a passive alignment may be performed, where the optical fiber may be aligned relative to the optical waveguide and/or the optical die using optical registration marks on the semiconductor package. In other example embodiments, active alignment may be used, where the optical die may be energized, such that it emits light (e.g., laser light emission from the edge of the optical die) and the optical fiber may be positioned with a feedback system such that a relatively optimized coupling of the light to the optical fiber is achieved. In other words, in active alignment, light emission and measurement thereof as guided by the optical fiber being positioned may be used as a guide for optimizing the placement and/or alignment of the optical fiber in the second cavity. At this point, when the optical fiber is held in place by the epoxy, such as in a B-stage state, an ultraviolet and/or thermal cure may be performed to cross-link and/or harden the epoxy in which the optical fiber is held. The semiconductor package may then have an optical die embedded therein, aligned to an optical waveguide also embedded in the semiconductor package and with an optical fiber optically coupled thereto. The optical die, optical waveguide, and optical fiber may be disposed in relative proximity to an edge of the semiconductor package.

It will be appreciated that the semiconductor package with embedded optical die with a mechanism for fabricating the same, as disclosed herein, may provide an advantage, in terms of optical path length, optical coupling losses, number of optical interfaces, manufacturability, form factor, and/or cost, compared to other processes and/or structures for providing optical signaling on an electrical semiconductor package. For example, by not surface mounting the optical dies, direct optical fiber coupling to the optical die and/or optical waveguides vertically through a semiconductor package and/or through a board (e.g., motherboard, PCB, etc.) may be avoided. Such surface mounted optical die solutions may present longer path lengths and/or increased difficulty in alignment and/or manufacturability compared to the structures and mechanisms discussed herein, with embedded optical die.

FIG. 1 depicts a simplified profile schematic diagram illustrating an example semiconductor package 100 with embedded optical dies 108, in accordance with example embodiments of the disclosure. The semiconductor package 100 may have a semiconductor package substrate 102 with one or more integrated circuits (ICs) 104 and/or one or more stacked dies (e.g., stacked memory dies) 106 disposed thereon. The embedded optical dies 108 may have one or more optical fibers 110 aligned and optically coupled thereto, in accordance with embodiments of the disclosure. The semiconductor package may further include one or more package-to-board interconnects 112 to electrically and mechanically connect the semiconductor package 100 with embedded optical dies 108 onto a board (e.g., PCB, motherboard, etc.).

Figure 2:
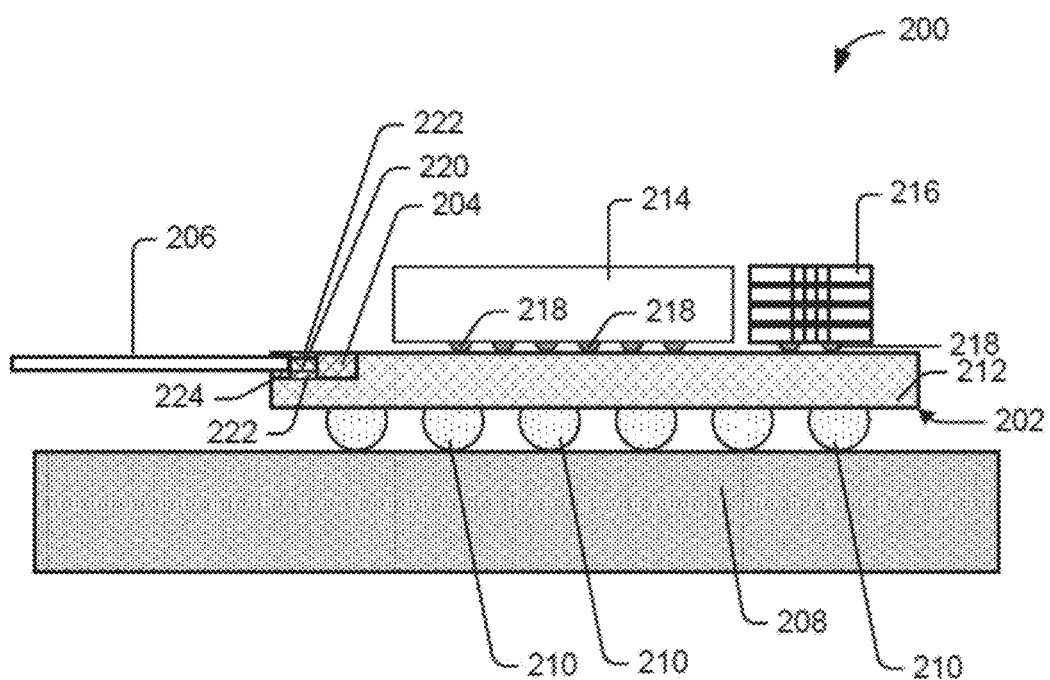
FIG. 2 depicts a simplified cross-sectional schematic diagram illustrating an electronic assembly 200 with a semiconductor package, similar to that of FIG. 1, disposed on a board 208 and having an embedded optical die 204, in accordance with example embodiments of the disclosure.

FIG. 2 depicts a simplified cross-sectional schematic diagram illustrating an electronic assembly 200 with a semiconductor package, similar to that of FIG. 1, disposed on a board 208 and having an embedded optical die 204, in accordance with example embodiments of the disclosure. The semiconductor package on board 208 may include a semiconductor package 202 with a semiconductor package substrate 212 with the optical die 204 embedded therein. The semiconductor package 202 may be assembled onto a board 208 with one or more package-to-board interconnects 210. The semiconductor package 202 may have one or more electronic components 214, 216 assembled thereon, such as an IC 214 and/or stacked memory 216. The electronic components 214, 216 may be attached, electrically and mechanically, by die-to-package interconnects 218. The semiconductor package 202 may further have a core 220, a bottom cladding and top cladding 222, the combination of which may provide a waveguide for radiation emitted by the embedded optical die 204. The semiconductor package 202 may still further have an optical fiber attached thereto via an epoxy 224.

According to example embodiments, the semiconductor package 202 may include the package substrate 212. In some cases, the package substrate 212 may be an organic structure. In other cases, the package substrate 212 may be inorganic (e.g., ceramic, glass, etc.). The package substrate 212 may, in example embodiments, include a core layer with one or more interconnect layers built up on one or both sides of the core layer. In example embodiments, the core may be fabricated of any suitable material, including polymer material, ceramic material, plastics, composite materials, glass, epoxy laminates of fiberglass sheets, FR-4 materials, FR-5 materials, combinations thereof, or the like. The core may have any suitable dielectric constant (k-value) and/or leakage current characteristics. It will be appreciated that in some alternative embodiments, a coreless integration may be used, where there is no core layer, but instead, only routing layers such as those formed in the build-up layers.

The build-up layers, as built up on the core, may have interconnects formed therein. The interconnects may provide electrical pathways for signals between electronic components (e.g., integrated circuits, passive devices, etc.), input/output (I/O) connections on the semiconductor package, signal fan out from/to the electronic components, signal connections between two or more electrical components, power delivery to electrical component(s), ground connections to electrical component(s), clock signal delivery to the electrical component(s), combinations thereof, or the like. The build-up layers may be fabricated on one or both sides of the package core. In some cases, there may be the same number of build-up layers on both sides of the package core. In other cases, the build-up layers formed on either side of the package core may be asymmetric. Furthermore, the core of the semiconductor package may have a plurality of through vias to make electrical connections from one side of the core to the other side of the core. Thus, through vias in the core may allow electrical connections between one or more build-up layers on the top of the semiconductor package to one or more build-up layers on the bottom of the semiconductor package. In some alternative embodiments, a coreless substrate may be used for the semiconductor package 202.

In example embodiments, the build-up layers of the semiconductor package 202 may be dielectric laminate, which may be any suitable material, including polymer material, ceramic material, plastics, composite materials, liquid crystal polymer (LCP), epoxy laminates of fiberglass sheets, prepreg, FR-4 materials, FR-5 materials, ABF, combinations thereof, or the like. In some example embodiments, the package core and the build-up dielectric material may be the same type of material. In other example embodiments, the package core and the build-up dielectric material may not be constructed of the same material type.

In example embodiments, the semiconductor package substrate 212 may be fabricated in a batch and/or bulk fashion, where multiple semiconductor package substrates 212 may be fabricated at one time. In other words, the semiconductor package substrate 212 may be singulated into separate semiconductor package substrates 212 after completing other fabrication processes in a batch fashion with other package substrates on a common panel. The package core may be of any suitable size and/or shape. For example, the package core, in example embodiments, may be a rectangular panel.

The one or more electronic components 214, 216, such as an integrated circuit die, may be electrically and mechanically coupled to the package substrate 212 via any suitable mechanism 218, such as metal pillars (e.g., copper pillars), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, or the like. In some example embodiments, the dies (e.g., integrated circuits) 214, 216 that are packaged in the semiconductor package 202, as described herein, may have input/output (I/O) connections 218 for various sizes. For example, a particular die may have finer pitch I/O connections than another die packaged on the semiconductor package. In example embodiments, the semiconductor package-to-board level interconnects 210 may be ball grid array (BGA) connections, other area connections, periphery connections, or the like.

The die(s) 214, 216 may be any suitable electronic components including, but not limited to, integrated circuits, surface mount devices, active devices, passive devices, diodes, transistors, connectors, resistors, inductors, capacitors, microelectromechanical systems (MEMSs), combinations thereof, or the like. In some cases, underfill (e.g., with or without filler materials) may be provided between the die 214, 216 and the semiconductor package 202, such as surrounding die-to-package interconnects 218.

The optical die 204 may be embedded within a cavity formed in the semiconductor package substrate 212. The cavity may be formed by any suitable mechanism, such as laser ablation, wet etch, dry etch, controlled depth saw, or the like. Thus portions of build-up layer may be removed, such as on an edge of the semiconductor package substrate 212, to accommodate the optical die, cladding 222 and core 220 materials, and the epoxy 224 held optical fiber 206. In some example embodiments, whole numbers of build-up dielectric may be removed on the edge of the semiconductor package substrate 212 to accommodate the optical die. In this case, a cavity formed in the semiconductor package substrate may be an integer multiple of the thickness of build-up layers used in the semiconductor package substrate 212. In example embodiments, the regions of build-up layers that may be removed to form a cavity for the optical die 204 and/or waveguide 220, 222 may have design rules to exclude any routing (e.g., metal traces, vias, etc.) in those regions.

As discussed above, the optical die 204 may be embedded, or at least partially embedded within the semiconductor package 202. In example embodiments, the optical die 204 may have one or more levels of interconnect layers (e.g., layers of build-up dielectric with vias and traces formed therein), as well as one or more levels of interconnect overlying the optical die. In some example embodiments, the optical die 204 may be any suitable type of optical die 204, such as an edge emitting laser diode. The optical die 204 may have electrical contacts on a top surface of the optical die. In example embodiments, electrical coupling may be made to the optical die 204 via the electrical contacts on the top surface of the optical die 204 via the one or more levels of interconnect formed covering the optical die 204. In other words, an electrical signal, such as one from an electrical component 214, 216 disposed on the semiconductor package 202, may be provided to the optical die via the one or more overlying interconnect layers to drive the optical die 204.

The core 220 and cladding 222 as disposed adjacent to the optical die 204 may be so that the radiative output from the optical die 204 (e.g., laser output from the edge of the optical die 204) may be coupled into the core 220 and total internal reflection (TIR) may be achieved within the core 220. In example embodiments, the refractive index of the core 220 may be greater than the refractive index of the cladding 222 allowing for TIR of light that may pass into the core 220 from the optical die 204. In example embodiments, the height of the lower cladding 222 may be such that the placement of the core 220 over the bottom cladding 222 is approximately at a position where laser emission may be provided on the edge of the optical die 204. Thus the laser emission form the optical die 204 may couple into the core 220 portion. In some example embodiments, the core 220 and the cladding may be in contact with the optical die 204. As discussed above, the formation of the core 220 and cladding 222, in some example embodiments, may entail a patterning process, where excess core and/or cladding epoxy may be removed, such as by an etch process.

The core 220, cladding 222, and/or optical die 204 may be covered with one or more levels of interconnect (e.g., one or more build-up layers, solder mask layer, etc.). The dielectric materials in these overlying materials, in addition to having conductive pathways (e.g., metal traces, vias, etc.) therein, may further partially fill in portions around the optical die 204 and the core 220 and cladding 222 near the edge of the semiconductor package 202.

The optical fiber 206 may be disposed in epoxy (e.g., cured B-stage epoxy, etc.) at an edge of the semiconductor package 202. In example embodiments, a butt of the optical fiber 206 may be in contact with or in relative proximity to the core 220. In example embodiments, the optical fiber may be aligned and/or positioned in a manner as to provide a relatively high optical coupling with the core 220 to accept light from the optical die 204. The optical fiber 206 may be of any suitable type, such as single-mode, multi-mode, or the like. In some example embodiments, as discussed above, the optical fiber 206 may be disposed on the semiconductor package 202 after the assembly of the electronic components 214, 216 on the semiconductor package 202.

FIGS. 3A-3H depict simplified cross-sectional schematic diagrams of example semiconductor packages with embedded optical die during processing, in accordance with example embodiments of the disclosure. Although the cross-sectional diagrams of FIGS. 3A-3H may depict some intermediary stages of fabricating a semiconductor package with one or more optical die embedded therein, it will be appreciated that there may be any other intermediary stages that may depict the same or similar process flow. It will further be appreciated that variations of the process flow, as depicted in FIGS. 3A-3H, are encompassed by the disclosure for semiconductor package with embedded optical die and the processes therefor.

Figure 3A:
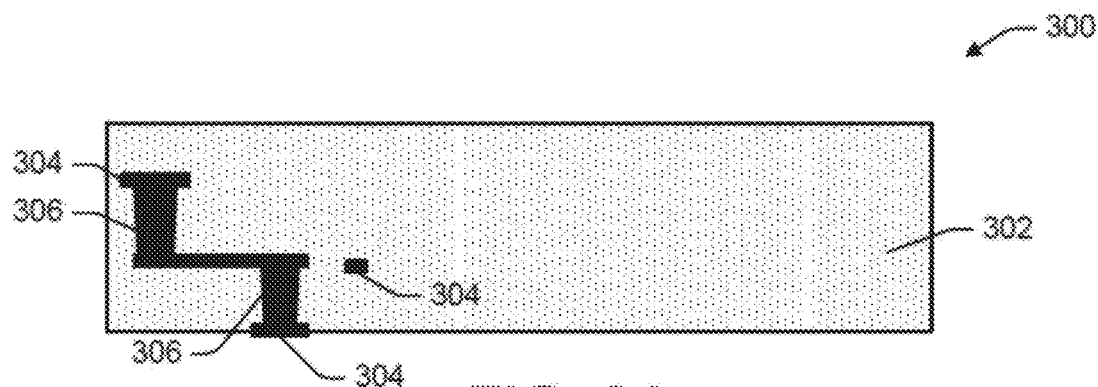
FIGS. 3A-3H depict simplified cross-sectional schematic diagrams of example semiconductor packages with embedded optical die during processing, in accordance with example embodiments of the disclosure.

FIG. 3A depicts a simplified cross-sectional schematic diagram of example semiconductor package 300 that has been partially fabricated with a package substrate 302 with vias 306 and traces 304 formed therein, in accordance with example embodiments of the disclosure. In example embodiments, the package substrate 302 may be formed with various dielectric materials, such as a core material and/or build-up material. In some example embodiments, a coreless integration may be used, where there may be no core material used in the package substrate 302.

The build-up layers or interconnect layer may be disposed by a variety of suitable processes. For example, dielectric material may be laminated on the semiconductor package core and/or underlying build-up layers. In example embodiments, the dielectric laminate may be any suitable material, including polymer material, ceramic material, plastics, composite materials, liquid crystal polymer (LCP), epoxy laminates of fiberglass sheets, pre-preg, FR-4 materials, FR-5 materials, ABF, combinations thereof, or the like. In some example embodiments, the package core and the build-up dielectric material may be the same type of material. In other example embodiments, the package core and the build-up dielectric material may not be constructed of the same material type. Vias 306 and/or trenches 304 in the build-up layers, may be formed by any suitable mechanism, such as a semi-additive process (SAP). Vias 306 and/or trenches 304 may be patterned in the build-up layer using any suitable mechanism, including photolithography, plasma etch, laser ablation, wet etch, combinations thereof, or the like. The vias 306 and trenches 304 may be defined by vertical and horizontal metal traces, respectively, within the build-up layer. The vias and trenches may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like.

Figure 3B:
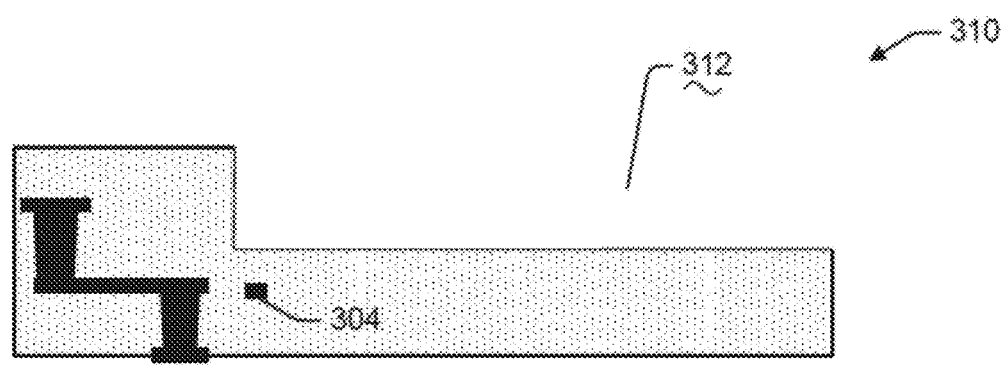

FIG. 3B depicts a simplified cross-sectional schematic diagram of example semiconductor package 310 that has been partially fabricated with a cavity 312 defined therein, in accordance with example embodiments of the disclosure. The cavity 312 may be defined in the dielectric material 302 by the removal of some of the dielectric material 302 of the semiconductor package 310. In some example embodiments, the cavity 312 may be formed by removing a full thickness in portions of one or more build-up layers on the surface of the semiconductor package 310, such as on the edge of the semiconductor package 310. The cavity 312 may be formed by any suitable mechanism, such as laser ablation, wet etch, dry etch, controlled depth saw, or the like. Design rules may be in place so that metal traces and/or vias are not formed in the portions of the dielectric 302 where the cavity 312 may be defined.

Figure 3C:
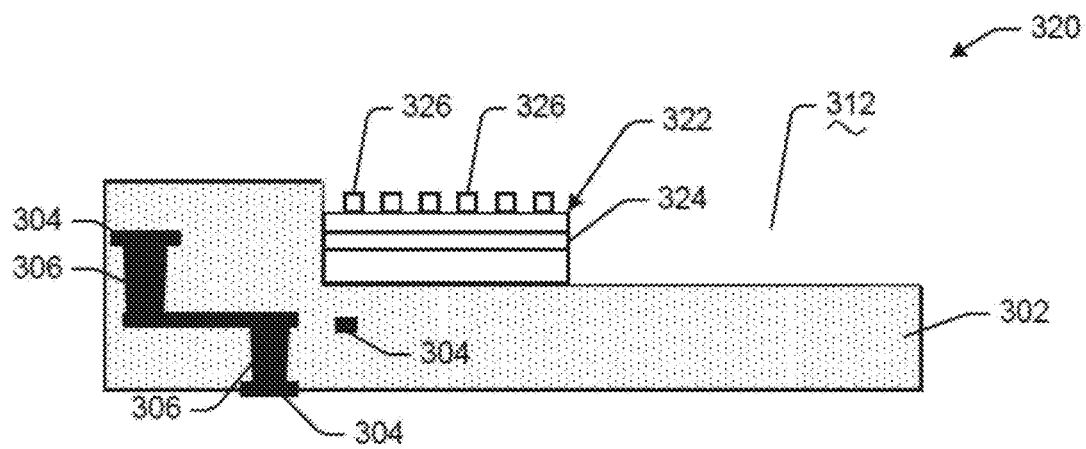

FIG. 3C depicts a simplified cross-sectional schematic diagram of example semiconductor package 320 that has been partially fabricated with a cavity 312 defined therein and an optical die 322 provided in the cavity 312, in accordance with example embodiments of the disclosure. In accordance with example embodiments of the disclosure, semiconductor packages 320 may have the optical die 322 placed in the cavity and sitting on portions of the dielectric material 302 of the semiconductor package 320. In some example embodiments, the optical die 322 may be positioned against a sidewall of the cavity 312. The optical die 322, in example embodiments, may be positioned and placed in the cavity 312 by a pick-and-place assembly tool. The optical die 322 may be any suitable type of optical die, such as an edge emitting laser diode. The optical die 322 may have optical emission from an edge 324 of the optical die 322, in some example embodiments. Furthermore, the optical die 322 may have electrical contacts 326 on a top surface of the optical die 322 (e.g., on a surface opposing the surface with which the optical die sits in the cavity). In some cases, the placement and/or alignment of the optical die 322 may be aided by pushing an end of the optical die up against an edge of the cavity 312, as defined within the build-up layers of the partially fabricated package substrate with optical die 322.

Figure 3D:
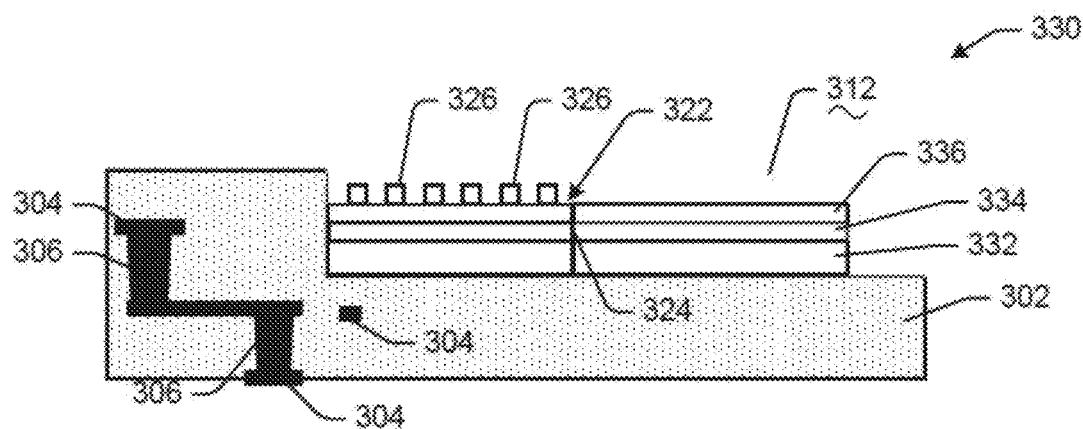

FIG. 3D depicts a simplified cross-sectional schematic diagram of example semiconductor package 330 that has been partially fabricated with elements of a waveguide 332, 334, 336 disposed within the cavity 312, in accordance with example embodiments of the disclosure. Optical epoxy may be deposited, such as with a nozzle, next to the optical die 322 and on a surface of build-up layer dielectric defining the cavity 312 to form the bottom cladding 332. The optical epoxy deposited to form the bottom cladding 332 may be cured, such as by a thermal and/or UV process. In some example embodiments, the bottom cladding 332 may be fabricated such that it is in contact with the optical die 322. In some example embodiments, the bottom cladding 332 may be of a height such that the overlying core may be substantially aligned with the optical emitting edge 324 of the optical die 322. The core 334 may be formed overlying the bottom cladding 332, such as by deposition and/or cure of optical epoxy, that provides a suitable refractive index and other properties for the core 334. In some example embodiments, the core 334 may have a refractive index that is greater than the refractive index of the bottom cladding 332 or the top cladding 336. After the core 334 optical epoxy is deposited, optical epoxy to form the top cladding 336 may be deposited. As in the case of the bottom cladding 332 and/or the core 334, the optical epoxy that may be used to form the top cladding 336 may be cured, such as by a thermal and/or UV process to promote cross-linking and/or hardening of the optical epoxy. In some cases, all or some of the bottom cladding 332, core 334, and/or top cladding 336 intermediary materials (e.g., optical epoxies) may be cured at the same time. The optical epoxy may be deposited in proximity of the optical die by a dispense nozzle, such as a dispense nozzle with sub-micron positional accuracy, according to some example embodiments. In some example embodiments, optical epoxy corresponding to a bottom cladding of the waveguide, an optical epoxy corresponding to the sandwiched core of the waveguide, and the optical epoxy corresponding to atop cladding of the waveguide may be disposed in sequence and either cured after each layer deposition or after the deposition of all of the layers of the waveguide.

In example embodiments, the formation of the waveguide having the bottom cladding 332, core 334, and top cladding 336 may involve a patterning process. For example, a bottom cladding layer, core layer, and top cladding layer may be formed that extends the full area of the cavity 312. In other words, material for each of the bottom cladding 332, core 334, and/or top cladding 336 may be present, after dispense of the same, in regions where those materials are not desired. As a result, a patterning and/or removal process may be performed to remove pre-final fabrication portions of and/or precursors to the bottom cladding 332, core 334, and/or the top cladding 336. In some example embodiments, the combination of the bottom cladding 332, core 332, and/or the top cladding 336 may have a height that may be substantially the same or similar to a height of the optical die 322.

The core portion 334 of the optical waveguide may have different properties (e.g., different refractive index, etc.) than the cladding portions 332, 336 of the optical waveguide. In some example embodiments, the core portion 334 of the optical waveguide may have a refractive index in the range of about 1.3 to about 1.8. In some example embodiments, the cladding portions 332, 336 of the optical waveguide may have a refractive index in the range of about 1.4 to about 1.8. In example embodiments, the optical waveguide may be formed with dimensions such that the core portion of the optical waveguide is relatively aligned with an optical output (e.g., edge laser emission) of the optical die. In other words, the optical waveguide may be formed in a manner such that the optical emission from the optical die may be substantially coupled to and guided (e.g., by total internal reflection) by the core of the optical waveguide.

Figure 3E:
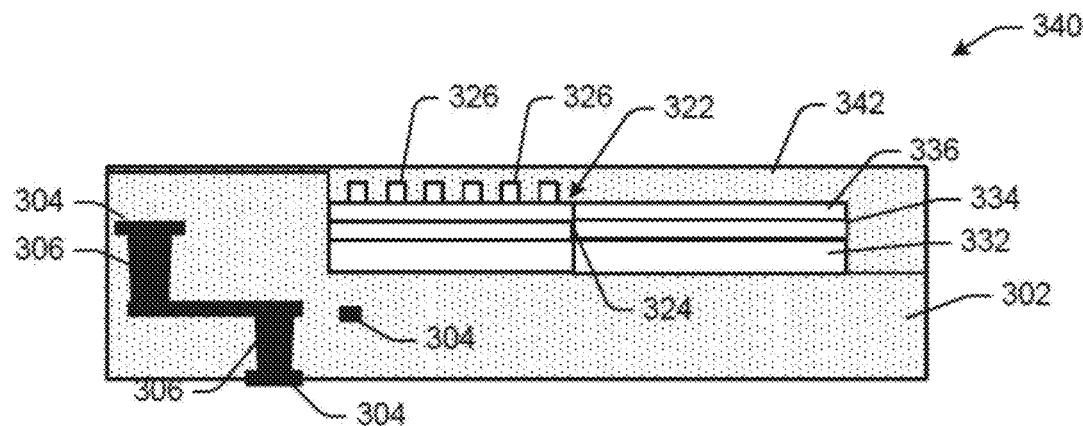

FIG. 3E depicts a simplified cross-sectional schematic diagram of example semiconductor package 340 that has been partially fabricated with dielectric material 342 formed over the elements of a waveguide 332, 334, 336 and the optical die 322, in accordance with example embodiments of the disclosure. The dielectric material 342 may be a part of an interconnect layer with vias and/or metallic traces that may be formed over the optical die 322, cladding 332, 336, and core 334. In example embodiments, the overlying layer may be any number of build-up layers and/or a solder mask layer. A build-up layer and/or a solder mask layer 342 may be formed over the semiconductor package 340 with the optical die 322 disposed in the cavity in a manner so that the electrical contacts 326 of the optical die 322 may be contacted by metallic traces on the interconnect layer(s) 342 formed overlying the optical die 322. In example embodiments, the dielectric material of the overlying interconnect layer 342 may encapsulate the optical die 322. Thus, in example embodiments, the dielectric (e.g., build-up laminate dielectric/pre-preg, etc.) may fill open portions of the cavity 312 in which the optical die 322 and the cladding 322, 326 and core 324 are disposed, to provide a substantially planarized top surface of the interconnect layer(s) 342 formed overlying the optical die 322 and the waveguide 332, 334, 336.

Figure 3F:
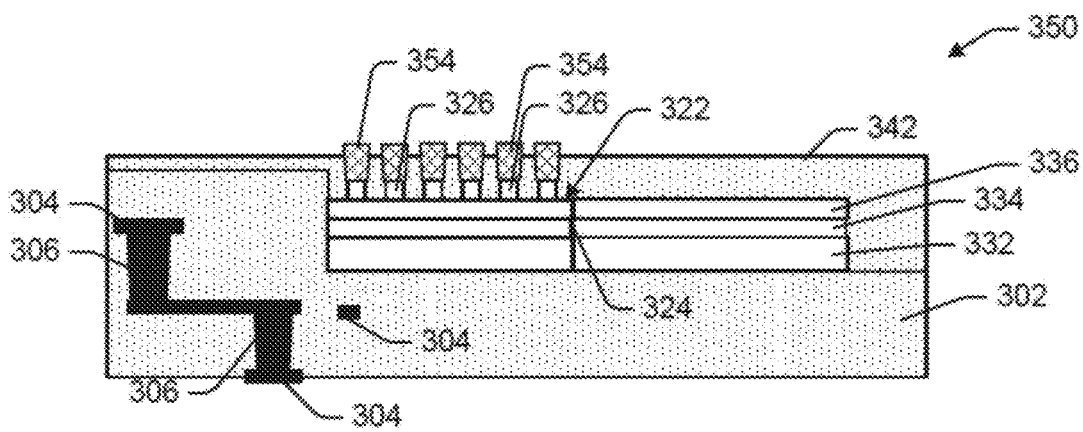

FIG. 3F depicts a simplified cross-sectional schematic diagram of example semiconductor package 350 that has been partially fabricated with elements of a waveguide with contacts 354 made to the electrical contacts 326 of the optical die 322, in accordance with example embodiments of the disclosure. In example embodiments, the electrical contacts 326 may be solder bumps on the surface of the semiconductor package 350.

In some example embodiments, at this stage, electronic components may be assembled onto the semiconductor package. The electronic components may be any suitable devices, including, for example, integrated circuit (IC) dies, radio frequency ICs (RFICs), surface mount devices (SMDs), connectors, passive components, active components, etc. There may be any suitable number of electronic components assembled onto the semiconductor package 350. In alternative embodiments, electronic components may be assembled after a second cavity is formed in the semiconductor package 350, as is described in conjunction with FIG. 3G. Electronic components may be mounted to the semiconductor package substrate 350 using a pick-and-place system to align the electronic components to the semiconductor package 350.

Any suitable mechanism of attachment (e.g., copper pillar, flip-chip, ACF, NCF, etc.) may be used for mounting the electronic components to the semiconductor package. The electronic components may be any suitable electronic components, such as ICs, RFICs, microcontrollers, baseband chips, microprocessors, memory chips, surface mount devices (SMDs), discrete components, transistors, diodes, resistors, inductors, capacitors, combinations thereof, or the like. In some cases, underfill (e.g., with or without filler materials) may be provided between the assembled electronic components and the semiconductor package 350. In some example embodiments, molding may be formed over the electronic components. In further example embodiments, electromagnetic shielding (EMI) may be formed around, such as within the molding, or as a metal can, around the one or more assembled electronic components.

Figure 3G:
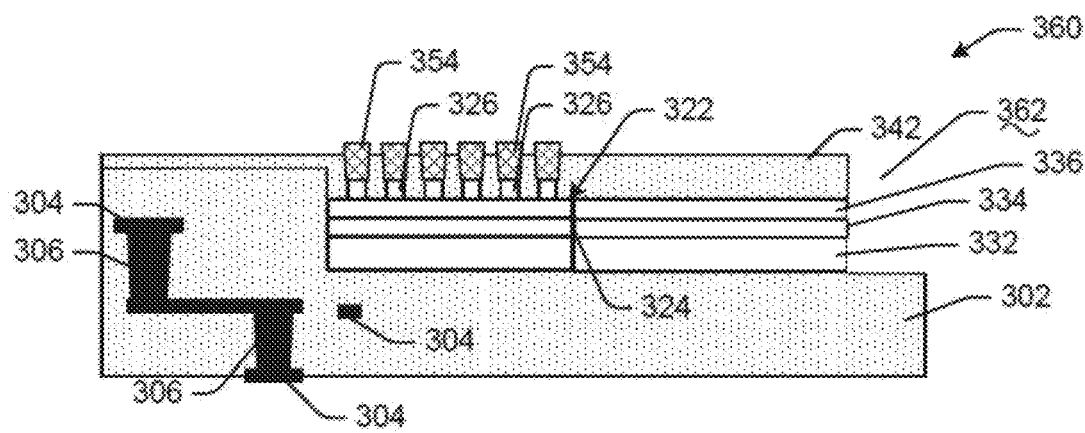

FIG. 3G depicts a simplified cross-sectional schematic diagram of example semiconductor package 360 that has been partially fabricated with a second cavity 362 defined by one or more interconnect layers, in accordance with example embodiments of the disclosure. After electronic components are assembled onto the semiconductor package, a second cavity may be formed adjacent to the optical waveguide. In example embodiments, this second cavity 362 may be formed in dielectric material that may have filled in portions of the first cavity 312 during the formation of the interconnect layers 342 overlying the optical die 322 and/or the optical waveguide 332, 334, 336. This second cavity 362 may be formed at the same or similar depth as the first cavity 312. In other example embodiments, the depth of the second cavity 362 may be different from the depth of the first cavity 312. In alternative embodiments, the second cavity 362 may be formed prior to assembly of dies and/or other electronic components onto the semiconductor package with embedded optical die. The second cavity 362 may be formed by the same or different process than the formation of the first cavity 312. These processes may include any one or more of laser ablation, wet etch, dry etch, control depth saw, combinations thereof, or the like.

It will also be appreciated that in example embodiments, where the semiconductor package substrate 360 may be formed on a panel with other semiconductor package substrates, a notch in the dielectric layers according to the desired depth of the second cavity 362 may be formed at locations where the panel may be singulated. Upon singulation through these notched locations, the edge cavities 362 may be formed across the multiple packages that may be singulated from a single panel. In this way, a relatively rapid and controlled mechanism may be used to form the packaged substrates with an edge cavity therein, prior to optical fiber attach.

Figure 3H:
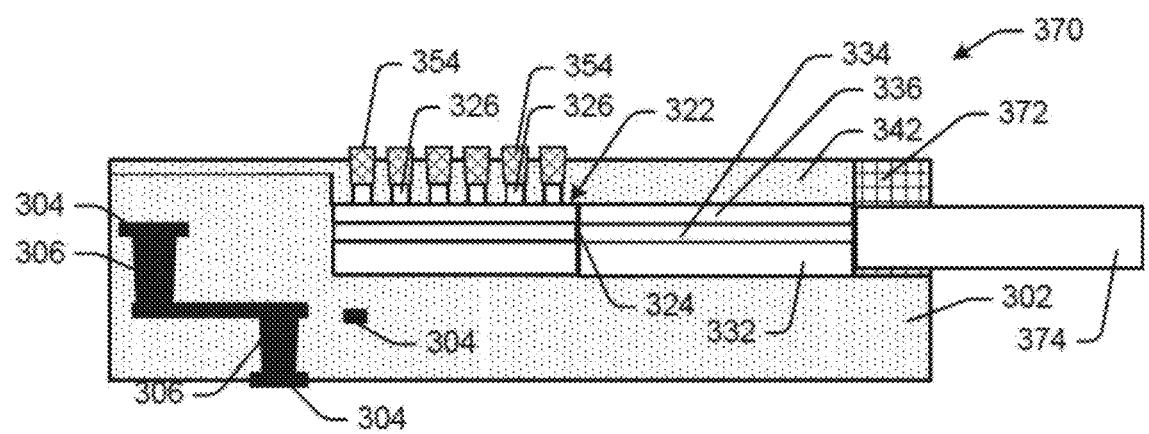

FIG. 3H depicts a simplified cross-sectional schematic diagram of example semiconductor package 370 that may have an optical fiber 374 attached thereto, in accordance with example embodiments of the disclosure. In example embodiments, epoxy 372 of any suitable type, such as a stage-B epoxy, may be deposited within the second cavity 362. In some cases, an optical epoxy may be used. In case there is residual epoxy between the optical fiber 374 and the core 334, an optical epoxy that is substantially transparent (e.g., having relatively high transmittance and/or relatively low absorbance) at the wavelength of the optical die 322 emission may be used. A positioning tool may be used to position and place a butt of the optical fiber 374 within the second cavity 362 such that the optical fiber 374 is relatively aligned with the optical waveguide 332, 334, 336. In other words, the optical fiber 374 may be placed such that light travelling through the core portion 334 of the optical waveguide may be coupled to the optical fiber 374. This alignment and placement mechanism may be achieved using a pick-and place tool, such as a tool that uses optical alignment to align objects to be bonded to each other. Such a pick-and-place tool may be modified to position an optical fiber, rather than or in addition to electronic components.

In some cases, a passive alignment may be performed, where the optical fiber 374 may be aligned relative to the optical waveguide 332, 334, 336 and/or the optical die 322 using optical registration marks on the semiconductor package 370. In other example embodiments, active alignment may be used, where the optical die 322 may be energized, such that it emits light (e.g., laser light emission from the edge of the optical die) and the optical fiber may be positioned with a feedback system such that a relatively optimized coupling of the light to the optical fiber is achieved. In other words, in active alignment, light emission and measurement thereof as guided by the optical fiber being positioned may be used as a guide for optimizing the placement and/or alignment of the optical fiber in the second cavity 362. At this point, when the optical fiber 374 is held in place by the epoxy 372, such as in a B-stage state, an ultraviolet and/or thermal cure may be performed to cross-link and/or harden the epoxy 372 in which the optical fiber 374 is held. The semiconductor package 370 may then have an optical die 322 embedded therein, aligned to an optical waveguide 332, 334, 336 also embedded in the semiconductor package 370 and with an optical fiber 374 optically coupled thereto. The optical die 322, optical waveguide 332, 334, 336, and optical fiber 374 may be disposed in relative proximity to an edge of the semiconductor package 370.

It will be appreciated that interconnects (e.g., metal traces and/or vias) may define electrical pathways for signals to/from electrical components that are mounted on the semiconductor package, as well as signals being routed to/from the optical die, to/from a board, and/or and other suitable component electrically and/or optically coupled to the semiconductor package. The semiconductor package may have any suitable number of interconnect layers and may further include package-to-board interconnects, such as BGA, LGA, or the like, to make contact to a motherboard or other PCB. The optical fiber may be used to route signals from one or more packages mounted on the same or different PCB, or to route signals between dies mounted on the same package. In example embodiments, the optical die may produce an optical signal modulated and/or encoded with information according to a received electrical signal, such as an electrical signal routed to the optical die by an overlying interconnect layer. Optical signals may include any variety of messaging signals, clock signals, and/or any variety of synchronization signals. Although the semiconductor package has been described in the contest of an optical die with optical emissions on a transmitting end, it will be appreciated that a similar structure and process may be used to fabricate embedded optical detectors onto a semiconductor package, such as for the purpose of receiving optical signals. In fact, a semiconductor package may include both an optical die for transmitting optical signals generated by performing an electrical-to-optical conversion of a signal and an optical detector die to receive another optical signal and perform an optical-to-electrical conversion of the received signal.

Figure 4:
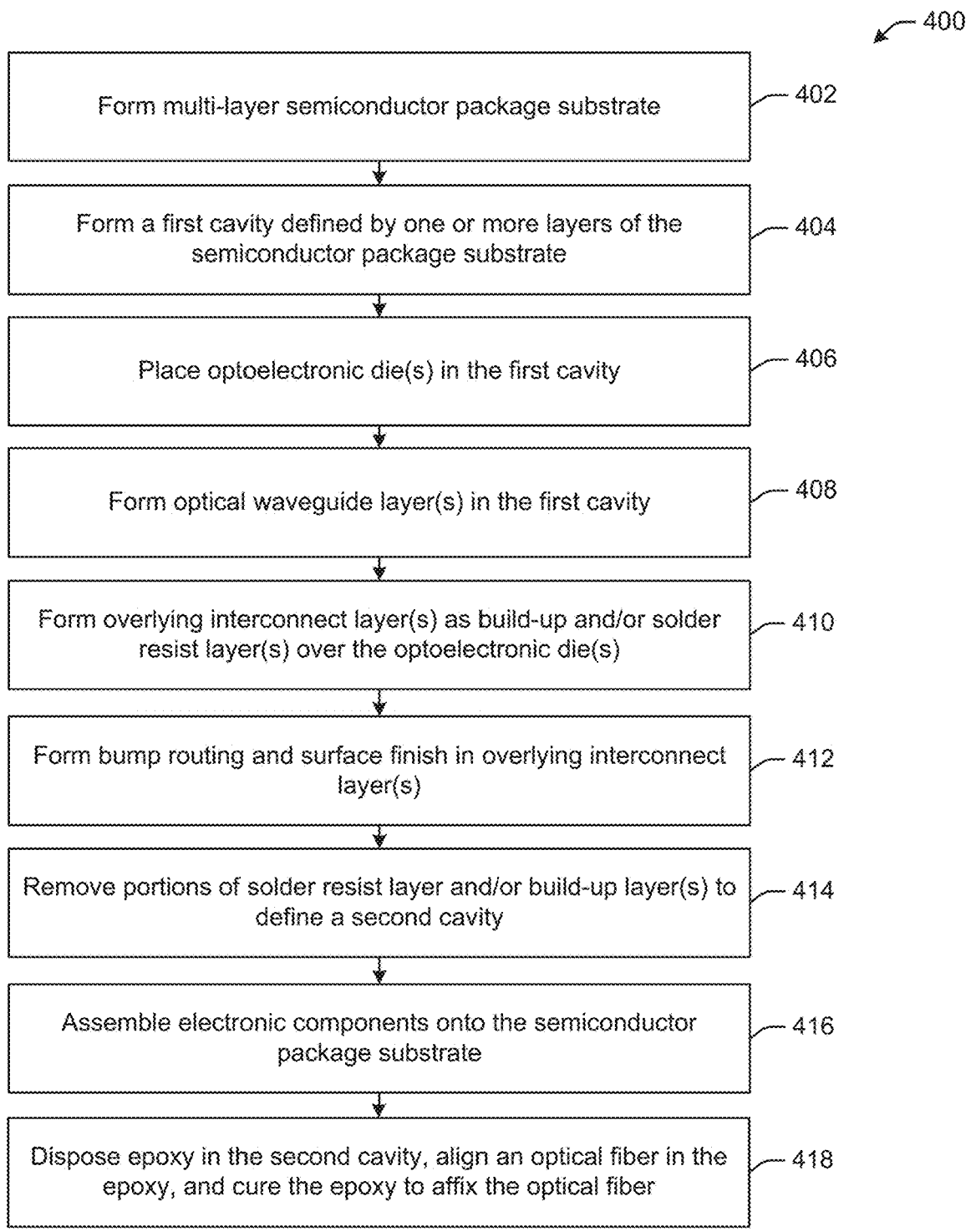
FIG. 4 depicts a flow diagram illustrating an example method for fabricating semiconductor packages with embedded optical die, in accordance with example embodiments of the disclosure.

FIG. 4 depicts a flow diagram illustrating an example method 400 for fabricating semiconductor packages with embedded optical die, in accordance with example embodiments of the disclosure. This method 400 may be used to fabricate any one or more of the structures of FIGS. 1, 2, and/or 3A-3H. In some example embodiments, the method 400, as described herein, may be performed in a batch fashion, such as when a plurality of semiconductor packages with embedded optical die may be fabricated on the same panel, and even as multiple panels that may be processed at the same time. In example embodiments, the semiconductor packages with optical die may be at least partially fabricated on a semiconductor package panel, and then singulated to individual semiconductor packages. It will further be appreciated that some processes may have suitable substitutes that may be implemented without deviating from embodiments of the disclosure.

At block 402, a multi-layer semiconductor package substrate may be formed. As discussed above the semiconductor package substrate may include any number of build-up layers and, in some example embodiments, may have a core. In other example embodiments, a coreless integration may be used to fabricate the semiconductor package. At block 404, a first cavity may be defined by one or more layers of the semiconductor package substrate. As discussed above, any variety of suitable mechanisms including, but not limited to, laser ablation, wet etch, dry etch, control depth saw, etc. may be used to form the first cavity. At block 406, optoelectronic die(s) may be placed in the first cavity. Any variety of suitable alignment (e.g., pick-and-place, etc.) mechanism may be used to align and/or place the optical die within the first cavity. In some example embodiments, features of the first cavity, such as sidewall(s), may be used to efficiently and/or more accurately align and/or place the optical die within the first cavity. For example a sidewall may be used as a guide to place the optical die, such as in contact with at least a portion of that sidewall.

At block 408, optical waveguide layer(s) may be formed in the first cavity. Optical waveguide formation may entail the formation of a sandwiched cladding/core/cladding structure. The core layer and the cladding layers may have dissimilar properties, such as refractive index, so that total internal reflection (TIR) may be achieved in the waveguide, as formed, and for the wavelength of the emissions of the optical die. Any variety of optical epoxies may be used to form the cladding/core/cladding sandwich structure. In example embodiments, the optical epoxies may be dispensed, such as from micro-nozzles with micron or sub-micron positional accuracies. In some example embodiments, the epoxies may be hardened by any variety of thermal and/or UV curing processes. In further example embodiments, patterning processes may be used for the purposes of defining the waveguide.

At block 410, overlying interconnect layer(s) may be formed as build-up and/or solder resist layer(s) over the optoelectronic die(s). This process may include, in example embodiments, making contact to electrical contacts overlying the optical die that is disposed in the first cavity. Thus dielectric material may be deposited over the optical die and the waveguide and electrical contacts may be formed therein to make electrical contact to the optical die. The dielectric material (e.g., build-up layer, pre-preg, ABF, etc.) may fill any open portions of the first cavity. It will further be appreciated that in example embodiments, this process may be performed on a panel where multiple semiconductor packages with embedded optical die are formed. Thus multiple first cavities corresponding to multiple packages may be filled on a panel with the formation of the one or more overlying interconnect layers. At block 412, bump routing and surface finish may be formed in the overlying interconnect layer(s). The bump routing and/or surface finishing may use any suitable material, such as electroplated nickel/gold (ENIG), or any other suitable process and/or material types. Bump may be formed using any suitable variety of electroplating and/or electroless processes with any suitable material, such as any variety of tin-based alloys.

At block 414, portions of the solder resist layer and/or build-up layer(s) may be removed to define a second cavity. This process may be similar to the formation of the first cavity, in example embodiments. Any variety of suitable mechanisms including, but not limited to, laser ablation, wet etch, dry etch, control depth saw, etc. may be used to form the second cavity. In some cases, the same type of process may be used to form the second cavity, as is used to form the first cavity. The second cavity, in example embodiments, may have an area less than that of the first cavity. The second cavity, in example embodiments, may have a depth substantially similar to that of the first cavity. At block 416, electronic components may be assembled onto the semiconductor package substrate. At block 418, epoxy may be disposed in the second cavity, an optical fiber may be aligned in the epoxy, and the epoxy may be cured to affix the optical fiber. As discussed above, any variety of passive and/or active mechanisms may be used to align the optical fiber to the embedded waveguide. The optical fiber may be any suitable optical fiber, including single mode, multi-mode, etc.

It should be noted, that the method 400 may be modified in various ways in accordance with certain embodiments of the disclosure. For example, one or more operations of the method 400 may be eliminated or executed out of order in other embodiments of the disclosure. Additionally, other operations may be added to the method 400 in accordance with other embodiments of the disclosure.

Figure 5:
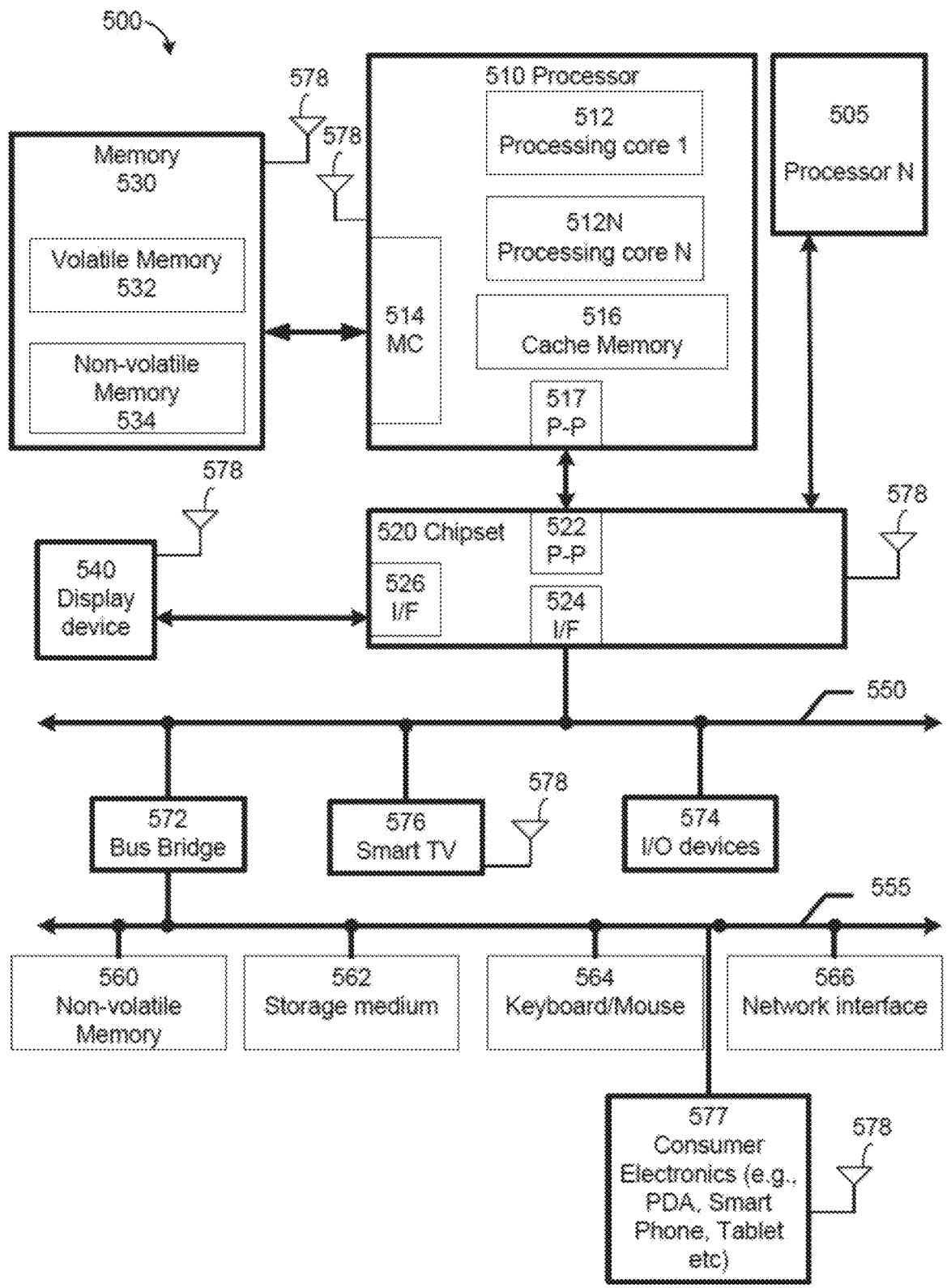
FIG. 5 depicts a system level diagram in accordance with example embodiments of the disclosure.

FIG. 5 depicts an example of a system 500 according to one or more embodiments of the disclosure. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 can include a system on a chip (SOC) system.

In one embodiment, system 500 includes multiple processors including processor 510 and processor N 505, where processor 505 has logic similar or identical to the logic of processor 510. In one embodiment, processor 510 has one or more processing cores (represented here by processing core 512 and processing core 512N, where 512N represents the Nth processor core inside processor 510, where N is a positive integer). More processing cores can be present (but not depicted in the diagram of FIG. 5). In some embodiments, processing core 512 includes, but is not limited to, pre-fetch logic to fetch instructions, decode logic to decode the instructions, execution logic to execute instructions, a combination thereof, or the like. In some embodiments, processor 510 has a cache memory 516 to cache instructions and/or data for system 500. Cache memory 516 may be organized into a hierarchical structure including one or more levels of cache memory.

In some embodiments, processor 510 includes a memory controller (MC) 514, which is configured to perform functions that enable the processor 510 to access and communicate with memory 530 that includes a volatile memory 532 and/or a non-volatile memory 534. In some embodiments, processor 510 can be coupled with memory 530 and chipset 520. Processor 510 may also be coupled to a wireless antenna 578 to communicate with any device configured to transmit and/or receive wireless signals. In one embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device. Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interface 517 and P-P interface 522. Chipset 520 enables processor 510 to connect to other elements in system 500. In some embodiments of the disclosure, P-P interface 517 and P-P interface 522 can operate in accordance with a PtP communication protocol, such as the Intel® QuickPath Interconnect (QPI) or the like. In other embodiments, a different interconnect may be used.

In some embodiments, chipset 520 can be configured to communicate with processor 510, 505N, display device 540, and other devices 572, 576, 574, 560, 562, 564, 566, 577, etc. Chipset 520 may also be coupled to the wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the disclosure, processor 510 and chipset 520 are integrated into a single SOC. In addition, chipset 520 connects to bus 550 and/or bus 555 that interconnect various elements 574, 560, 562, 564, and 566. Bus 550 and bus 555 may be interconnected via a bus bridge 572. In one embodiment, chipset 520 couples with a non-volatile memory 560, a mass storage device(s) 562, a keyboard/mouse 564, and a network interface 566 via interface 524 and/or 526, smart TV 576, consumer electronics 577, etc.

In one embodiment, mass storage device(s) 562 can include, but not be limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 or selected elements thereof can be incorporated into processor core 512.

It is noted that the system 500 described herein may be any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages (for example, the semiconductor packages described in connection with any of FIGS. 1-4), as disclosed herein, may be provided in any variety of electronic device including consumer, industrial, military, communications, infrastructural, and/or other electronic devices.

It will be appreciated that the apparatus described herein may be any suitable type of microelectronics packaging and configurations thereof, including, for example, system in a package (SiP), system on a package (SOP), package on package (PoP), interposer package, 3D stacked package, etc. In fact, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages, as disclosed herein, may be provided in any variety of electronic device including consumer, industrial, military, communications, infrastructural, and/or other electronic devices.

The semiconductor package, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the semiconductor package, as described herein, may be used to house one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the semiconductor package is provided may be a computing device. Such a computing device may house one or more boards on which the semiconductor package connections may be disposed. The board may include a number of components including, but not limited to, a processor and/or at least one communication chip. The processor may be physically and electrically connected to the board through, for example, electrical connections of the semiconductor package. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

According to example embodiments of the disclosure, there may be a semiconductor package, having a first interconnect layer; an optical die disposed over the first interconnect layer; a second interconnect layer disposed over the optical die, wherein the second interconnect layer includes at least one metal trace electrically coupled to the optical die; and an optical fiber optically coupled to the optical die and attached using an epoxy. In some example embodiments, the semiconductor package may include a waveguide optically coupled to the optical die, wherein the second interconnect layer overlies the waveguide. In further example embodiments, the waveguide may include a bottom cladding layer, a core layer, and a top cladding layer. In still further example embodiments, the optical die includes an edge emitting laser, wherein the edge emitting laser is aligned with the core layer. In yet further example embodiments, a third interconnect layer may be disposed over the first interconnect layer and underlying the second interconnect layer. In some example embodiments, the optical die is disposed overlying a first portion of the first interconnect layer and the third interconnect layer is disposed overlying a second portion of the first interconnect layer, wherein the third interconnect layer is not disposed on the first portion of the first interconnect layer.

In some example embodiments of the disclosure, the second interconnect layer includes a dielectric material and wherein the optical die is encapsulated by the dielectric material. In further example embodiments, the epoxy overlies a first portion of the first interconnect layer and the second interconnect layer overlies a second potion of the first interconnect layer, wherein the second interconnect layer does not overlie the second portion of the first interconnect layer. In still further example embodiments, the semiconductor package may include at least one electronic component, wherein the at least one electronic component is electrically coupled to the optical die via the second interconnect layer. In still further example embodiments, the epoxy includes at least one of: (i) an optical epoxy, or (ii) a B-stage epoxy. In some example embodiments, the semiconductor package includes one or more package-to-board interconnects.

According to example embodiments of the disclosure, there may be a method including providing a semiconductor package substrate having a first interconnect layer, wherein the first interconnect layer includes a first dielectric material; removing a first portion of the first dielectric material to define a first cavity; providing an optical die in the first cavity; forming an optical waveguide in the first cavity; forming a second interconnect layer overlying the optical die, the second interconnect layer having a second dielectric material; removing a second portion of the second dielectric material to define a second cavity; and providing an optical fiber in the second cavity optically coupled to the optical die. In some example embodiments, the first interconnect layer includes one or more metallic traces. In still further example embodiments, removing the first portion of the first dielectric material comprises at least one of: (i) laser ablation, (ii) wet etch, (iii) dry etch, or (iv) controlled depth saw. In yet further example embodiments, removing the first portion of the first dielectric material comprises removing the first portion of the first dielectric material at an edge of the semiconductor package substrate.

According to example embodiments of the disclosure, forming the optical waveguide in the first cavity further includes forming a bottom cladding layer; forming a core layer, wherein the core layer is aligned with an emitting edge of the optical die; and forming a top cladding layer. In further example embodiments, forming a second interconnect layer overlying the optical die includes forming a metallic trace in the second interconnect layer, wherein the metallic trace is electrically coupled to at least one electrical contact of the optical die. In still further example embodiments, the method includes assembling one or more integrated circuits over the second interconnect layer. In yet further example embodiments, providing the optical fiber in the second cavity and optically coupled to the optical die includes providing epoxy on the second cavity; aligning and placing the optical fiber in the epoxy; and curing the epoxy. In some further example embodiments, aligning the optical fiber includes energizing the optical die; monitoring an intensity of optical output coupled to the optical fiber from the optical die; and aligning the optical fiber based at least in part on the intensity.

The claimed invention is:

1. A semiconductor package, comprising:
   a first interconnect layer comprising a first dielectric material;
   a cavity defined by a removal of a first portion of the first dielectric material;
   an embedded optical die deposited in the cavity;
   a waveguide deposited adjacent to the embedded optical die in the cavity;
   a core portion sandwiched between cladding portions, wherein the core portion is aligned with an optical output of the embedded optical die, and the cladding portions are formed by depositing optical epoxy adjacent to the embedded optical die within the cavity;
   a second cavity that is defined by removing a second portion of the second dielectric material;
   an optical fiber included in the second cavity, wherein direct coupling to the embedded optical die is avoided by not surface mounting the embedded optical die; and
   a second dielectric material deposited in a manner to fill open portions of the cavity in which the embedded optical die and waveguide are deposited providing a substantially planarized top surface of the first interconnect layer.

2. The semiconductor package of claim 1, wherein the first interconnect layer includes one or more metallic traces.

3. The semiconductor package of claim 1, wherein the first cavity in the portion of the first dielectric material is formed using at least one of laser ablation, wet etch, dry etch, or controlled depth saw.

4. The semiconductor package of claim 1, wherein a second interconnect layer overlies the waveguide.

5. The semiconductor package of claim 4, wherein the second interconnect layer includes the second dielectric material.

6. The semiconductor package of claim 1, wherein the waveguide comprises a bottom cladding layer, a core layer, and a top cladding layer.

7. The semiconductor package of claim 6, wherein the embedded optical die comprises an edge emitting laser aligned with the core layer.

8. The semiconductor package of claim 1, further comprising an epoxy in the first cavity to attach the optical fiber in the first cavity.

9. The semiconductor package of claim 8, wherein the epoxy comprises at least one of an optical epoxy, or a B-stage epoxy.

10. A method, comprising:
    providing a semiconductor package substrate having a first interconnect layer, wherein the first interconnect layer includes a first dielectric material;
    removing a portion of the first dielectric material to define a first cavity;
    providing an embedded optical die in the first cavity;
    forming an optical waveguide in the first cavity;
    forming a core portion sandwiched between cladding portions, wherein the core portion is aligned with an optical output of the embedded optical die, and the cladding portions are formed by depositing optical epoxy adjacent to the embedded optical die within the first cavity;
    forming a second interconnect layer overlying the embedded optical die, the second interconnect layer having a second dielectric material;
    removing a portion of the second dielectric material to define a second cavity; and
    providing an optical fiber in the second cavity, wherein direct optical fiber coupling to the embedded optical die is avoided by not surface mounting the embedded optical die.

11. The method of claim 10, wherein removing the portion of the first dielectric material comprises removing the portion of the first dielectric material at an edge of the semiconductor package substrate.

12. The method of claim 10, wherein forming the optical waveguide in the first cavity further comprises:
    forming a bottom cladding layer;
    forming a core layer, wherein the core layer is aligned with an emitting edge of the embedded optical die; and
    forming a top cladding layer.

13. The method of claim 10, wherein forming a second interconnect layer overlying the embedded optical die comprises forming a metallic trace in the second interconnect layer, wherein the metallic trace is electrically coupled to at least one electrical contact of the embedded optical die.

14. An electronic device, comprising:
    a semiconductor package, wherein the semiconductor package comprises:
    a first interconnect layer comprising a first dielectric material;
    a cavity in a portion of the first dielectric material;
    an embedded optical die in the cavity;
    a waveguide adjacent to the embedded optical die in the cavity;
    a core portion sandwiched between cladding portions, wherein the core portion is aligned with an optical output of the embedded optical die, and the cladding portions are formed by depositing optical epoxy adjacent to the embedded optical die within the cavity;
    a second dielectric material in open portions of the cavity that includes the embedded optical die and waveguide, the second dielectric material providing a substantially planarized top surface of the first interconnect layer;
    a further cavity in a portion of the second dielectric material; and
    an optical fiber in the further cavity, wherein direct coupling to the embedded optical die is avoided by not surface mounting the embedded optical die.

15. The electronic device of claim 14, wherein the first interconnect layer includes one or more metallic traces.

16. The electronic device of claim 14, wherein the cavity in the portion of the first dielectric material is provided using at least one of laser ablation, wet etch, dry etch, or controlled depth saw.

17. The electronic device of claim 14, wherein a second interconnect layer overlies the waveguide.

18. The electronic device of claim 17, wherein the second interconnect layer includes the second dielectric material.

* * * * *

UNITED STATES PATENT AND TRADEMARK OFFICE
CERTIFICATE OF CORRECTION

| | |
|---|---|
| PATENT NO. | : 12,078,853 B2 |
| APPLICATION NO. | : 17/474484 |
| DATED | : September 3, 2024 |
| INVENTOR(S) | : Vivek Raghunathan et al. |

It is certified that error appears in the above-identified patent and that said Letters Patent is hereby corrected as shown below:

In the Claims

In Column 19, Claim 1, Line 28, delete "a" and insert -- a first --, therefor.

In Column 19, Claim 1, Line 28, delete "defined by a removal of a first" and insert -- in a --, therefor.

In Column 19, Claim 1, Line 30, delete "die deposited in the" and insert -- die in the first --, therefor.

In Column 19, Claim 1, Line 31, delete "waveguide deposited" and insert -- waveguide --, therefor.

In Column 19, Claim 1, Line 32, delete "cavity;" and insert -- first cavity; --, therefor.

In Column 19, Claim 1, Line 37, delete "cavity;" and insert -- first cavity; --, therefor.

In Column 19, Claim 1, Line 38, delete "a" and insert -- a second dielectric material in open portions of the first cavity with the embedded optical die and waveguide, wherein the second dielectric material provides a substantially planarized top surface of the first interconnect layer; a --, therefor.

In Column 19, Claim 1, Lines 38-39, delete "cavity that is defined by removing a second portion" and insert -- cavity in a portion --, therefor.

In Column 19, Claim 1, Line 39, delete "material;" and insert -- material; and --, therefor.

In Column 19, Claim 1, Line 40, delete "fiber included" and insert -- fiber --, therefor.

In Column 19, Claim 1, Lines 42-47, delete "die; and a second dielectric material deposited in a manner to fill open portions of the cavity in which the embedded optical die and waveguide are deposited providing a substantially planarized top surface of the first interconnect layer." and insert -- die. --, therefor.

Signed and Sealed this
Twenty-ninth Day of October, 2024

*Katherine Kelly Vidal*
Katherine Kelly Vidal
*Director of the United States Patent and Trademark Office*